United States Patent [19]

Hamada

[11] 4,004,246
[45] Jan. 18, 1977

[54] PULSE WIDTH MODULATED SIGNAL AMPLIFIER

[76] Inventor: Osamu Hamada, 3-4-7 Nakamagome, Ota Tokyo, Japan

[22] Filed: June 3, 1975

[21] Appl. No.: 583,461

[30] Foreign Application Priority Data

June 6, 1974   Japan .............................. 49-64304

[52] U.S. Cl. .................................. 330/10; 330/28; 330/75; 330/207 A
[51] Int. Cl.² .......................................... H03F 3/38
[58] Field of Search ............ 330/10, 75, 207 A, 28; 329/106

[56] References Cited

UNITED STATES PATENTS

| | | | |
|---|---|---|---|
| 3,273,007 | 9/1966 | Schneider | 307/228 X |
| 3,376,515 | 4/1968 | Dilley | 330/30 D X |
| 3,400,334 | 9/1968 | Ross et al. | 330/10 |
| 3,585,517 | 6/1971 | Herbert | 330/10 |

OTHER PUBLICATIONS

Crowhurst "40 Watts in 40 Ounces! The Two–State Amplifier," *Radio–Electronics*, Aug. 1965, pp. 35–38.

*Primary Examiner*—James B. Mullins
*Attorney, Agent, or Firm*—Hill, Gross, Simpson, Van Santen, Steadman, Chiara & Simpson

[57] ABSTRACT

A pulse width modulated signal amplifier system includes a signal input circuit, an amplifier for receiving an input signal from the signal input circuit, a pulse width modulator for receiving an output signal from the amplifier and producing a pulse width modulated signal, and a phase splitter for receiving the pulse width modulated signal and producing a pair of corresponding pulse width modulated signals having different polarities to each other. The system further includes a first demodulator for receiving one of the pair of pulse width modulated signals and demodulating a first output signal having one polarity and an amplitude in response to the input signal, a second demodulator for receiving the other of the pair of pulse width modulated signals and producing a second output signal having the other polarity and an amplitude in response to the input signal, a load supplied with the first and second output signals, an amplitude comparator for comparing the first and second output signals and producing a control signal in response to the comparison result, and a feedback circuit for receiving the control signal and applying it to the amplifier so as to balance the first and second output signal amplitudes.

9 Claims, 12 Drawing Figures

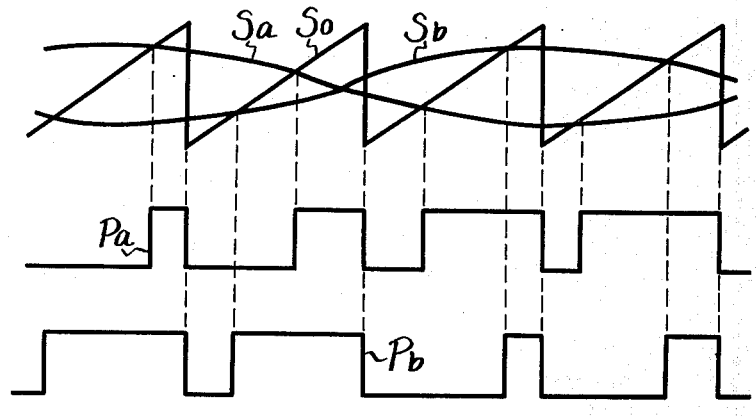
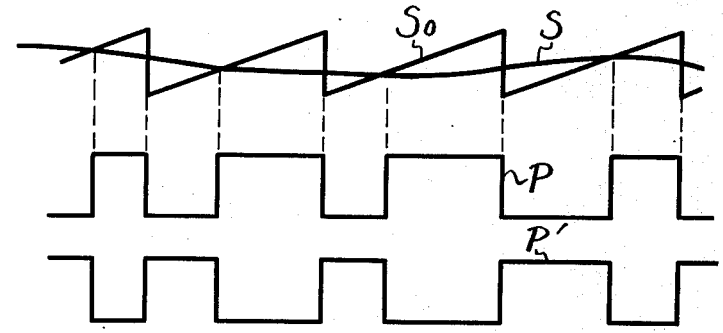

PULSE WIDTH MODULATED SIGNAL AMPLIFIER

BACKGROUND OF THE INVENTION

1. Field of the Invention

The present invention relates generally to a pulse width modulated signal amplifier, and more directly to a pulse width modulated signal amplifier of the type which drives a load by a pair of drive signals in complementary phase relationship to each other.

2. Description of the Prior Art

In a prior art Class B amplifier in which a load is driven in the BTL (balanced transformerless) system, a pair of pulse modulators are used to modulate a signal with a pair of modulating signals, which are opposite in phase with each other, to produce a pulse width modulated positive signal and a pulse width modulated negative signal reverse in phase from the former. These signals are then supplied through low pass filters to both ends of the load.

In order to obtain a pulse width modulated signal, in general, as shown in FIG. 1A, a sawtooth waveform signal $S_o$ is sliced with a modulating signal, for example, a low frequency signal $S_a$, to produce a pulse width modulated signal $P_a$ shown in FIG. 1B. In the prior art, the same sawtooth waveform signal $S_o$ is sliced at the same time with a low frequency signal $S_b$ which is opposite in phase from the former to produce a pulse width modulated signal $P_b$ shown in FIG. 1C. By this method, however, both the pulse modulated signals $P_a$ and $P_b$ cannot be generated perfectly opposite in phase. As a result, noises cannot be substantially removed. Furthermore, in the prior art, two systems of negative feedback loops are necessary for the respective modulators, which results in complicated circuit construction.

SUMMARY OF THE INVENTION

According to the present invention, a pulse width modulated signal amplifier system is provided. The system comprises a signal input circuit, an amplifier for receiving an input signal from the signal input circuit, a pulse width modulator for receiving an output signal from the amplifier and producing a pulse width modulated signal, and a phase splitter for receiving the pulse width modulated signal and producing a pair of corresponding pulse width modulated signals having different polarities to each other. Also provided are first and second demodulators each demodulating first and second output signals having opposite phases to each other and amplitudes in response to the input signal, a load supplied with the first and second output signals, an amplitude comparator for comparing the first and second output signals and producing a control signal in response to the comparison result, and a feedback circuit for receiving the control signal and applying it to the amplifier so as to balance the amplitudes of the first and second output signals.

Accordingly, an object of the present invention is to provide a pulse width modulated signal amplifier which is free from the defects of the prior art.

Another object of the present invention is to provide a pulse width modulated signal amplifier which drives a load with signals reverse in phase.

A further object of the present invention is to provide a pulse width modulated signal amplifier having a feedback loop to make the level of signals, which drive a load in reverse phase, balanced with each other.

Another object of the present invention is to provide a pulse width modulated signal amplifier in which a pair of signals driving a load are completely reverse in phase.

Other objects, features and advantages of the present invention will become apparent from the following description taken in conjunction with the accompanying drawings.

BRIEF DESCRIPTION OF THE DRAWINGS

FIGS. 1A, 1B and 1C are waveform diagrams used for explaining the operation of a prior art pulse width modulated signal amplifier;

FIGS. 4A to 4E, inclusive, are waveform diagrams used for explaining the operation of the circuit shown in FIG. 3; and FIGS. 5 and 6 are circuit diagrams respectively showing phase splitters which may be usable in the invention shown in FIG. 2.

DESCRIPTION OF THE PREFERRED EMBODIMENT

An embodiment of the pulse width modulated signal amplifier according to the present invention will now be described with reference to the drawings.

Figure 2:
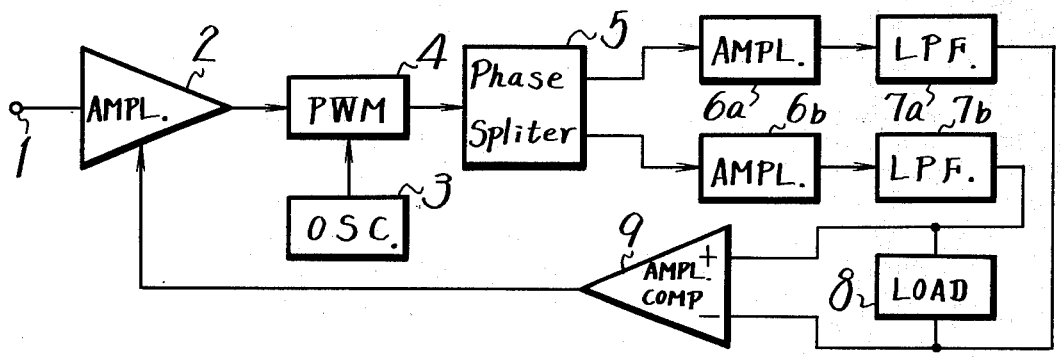
FIG. 2 is a block diagram showing an embodiment of the pulse width modulated signal amplifier according to the present invention.

FIG. 2 is a block diagram showing an example of the invention. In FIG. 2, reference numeral 1 designates an input terminal to which a modulating signal (low frequency signal) is applied, 2 an amplifier for receiving the modulating signal and amplifying the same, 3 an oscillator which generates a pulse signal with a duty cycle of 50% (carrier signal), and 4 a pulse width modulator which is supplied with the output signal from the amplifier 2 and the oscillator 3.

A pulse width modulated signal from the pulse width modulator 4 is applied to a phase splitter 5 which produces at its output side a positive polarity signal and a negative polarity signal reverse from the former. If necessary, both signals from the phase splitter 5 are then amplified by amplifiers 6a and 6b, respectively, and then applied through low pass filters 7a and 7b, to remove the carrier signal components from the signals applied thereto and produce respective low frequency signals which are applied to a load 8.

The signals which pass through the pair of low pass filters 7a and 7b are also applied to an amplitude comparator 9 which produces at its output side a difference signal between the output signals from the low pass filters 7a and 7b. The difference signal thus produced is negatively fed back to the amplifier 2. In the example shown in FIG. 2, all the elements are coupled directly, so that the DC components in the signals are also transmitted through the circuit.

Figure 3:
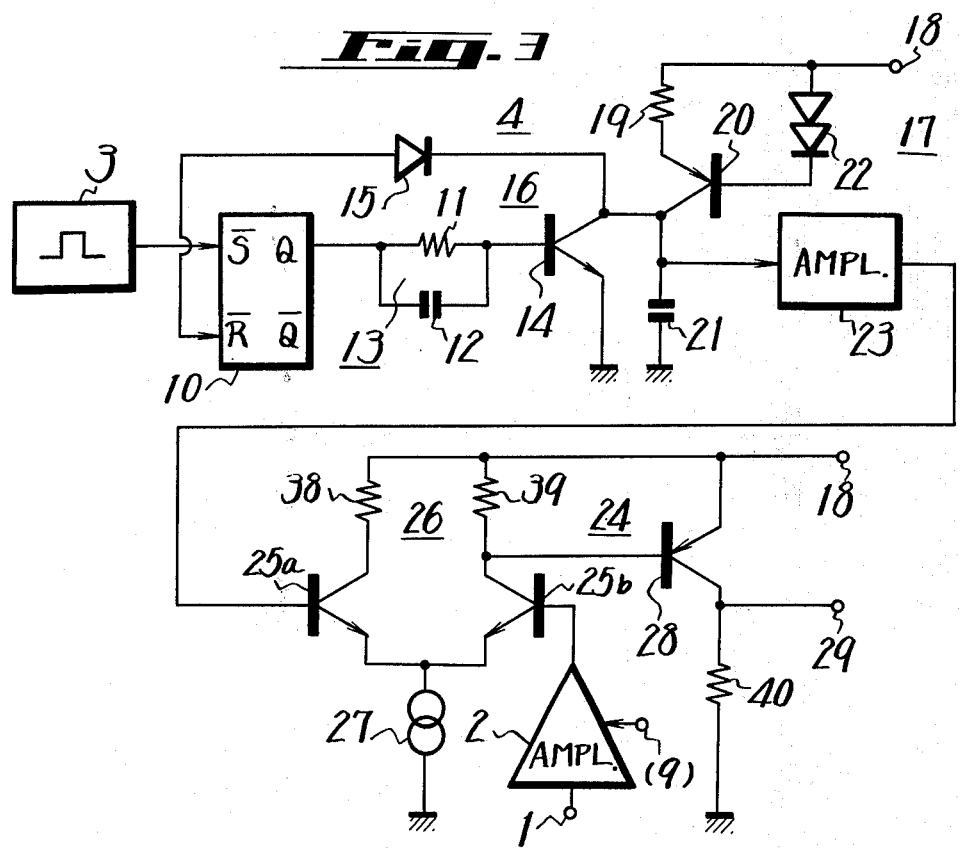
FIG. 3 is a circuit diagram showing an embodiment of the pulse width modulator which may be used in the invention shown in FIG. 2.

An example of the pulse width modulator 4 will be now described with reference to FIG. 3. In FIG. 3, reference numeral 16 generally indicates a pulse generator circuit which produces a pulse signal $P_t$ shown in FIG. 4B. The oscillator 3 produces a pulse signal $P_o$ with a duty cycle of 50% (shown in FIG. 4A), which is applied to a set terminal $\overline{S}$ of a bi-stable circuit 10 (in this embodiment, the bi-stable circuit 10 is set at the trailing edge of the pulse $P_o$). The output signal from the bi-stable circuit 10 is supplied through a parallel circuit 13 of a resistor 11 and a capacitor 12 to the base of a transistor 14, and an output signal obtained at the collector of the transistor 14 is applied through a diode 15 to a reset terminal $\bar{R}$ of the bi-stable circuit 10 (in this example, the bi-stable circuit 10 is reset when the transistor 14 is made ON). Thus, the pulse $P_t$ shown in FIG. 4B is obtained at an output terminal Q of the bi-stable circuit 10.

In FIG. 3, reference numeral 17 generally denotes a sawtooth waveform signal generator circuit in which a DC voltage source terminal 18 is grounded through a path comprising a resistor 19, the emitter-collector path of a transistor 20, and a capacitor 21. A diode 22 is inserted between the DC voltage source terminal 18 and the base of the transistor 20. The changing DC voltage across the capacitor 21 is amplified by an amplifier 23, if necessary. The collector of the transistor 14 of the pulse generator circuit 16 is connected to the junction of the collector of the transistor 20 and the capacitor 21.

With the above circuit construction, the transistor 20 and the diode 22 form a constant current circuit, and hence the capacitor 21 is always supplied with a constant current through the emitter-collector path of the transistor 20. Therefore, within a time period T in which the transistor 14 conducts with the pulse signal $P_t$, the charge stored in the capacitor 21 is discharged through the transistor 14. As a result, a sawtooth waveform signal $S_o$ shown in FIG. 4C is obtained across the capacitor 21 (at the output terminal of the amplifier 23).

In FIG. 3, reference numeral 24 generally designates a slicer circuit for the sawtooth waveform signal $S_o$ with the modulating signal, in which a pair of transistors 25a and 25b form a so-called differential amplifier 26. The sawtooth waveform signal $S_o$ is supplied from the amplifier 23 to the base of the transistor 25a, while a modulating signal (for example, a low frequency signal) S shown in FIG. 4C is supplied to the base of the other transistor 25b from the input terminal 1 through the amplifier 2, respectively. Furthermore, the emitters of both the transistors 25a and 25b are connected together to a constant current source 27. The collectors of the transistors 25a and 25b are connected through resistors 38 and 29 to the DC voltage source terminal 18, respectively. The base of an output transistor 28 is connected to the collector of the transistor 25b. The emitter of the output transistor 28 is connected to the terminal 18. The collector of the transistor 28 is grounded through a resistor 40, and an output terminal 29 connects with the collector of the transistor 28, respectively.

With the slicer circuit 24 described above, the differential amplifier 26 switches according to excursions of the signal $S_o$ across the low frequency signal S (shown in FIG. 4C) which serves as a boundary, so that a pulse width modulated signal P shown in FIG. 4D can be obtained at the output terminal 29.

An example of the phase splitter 5 used in this invention will be now described with reference to FIG. 5. As shown in FIG. 5, a pair of transistors 30a and 30b form a so-called differential amplifier 31. When the pulse signal P obtained at the output terminal 29 (refer to FIG. 3) and shown in FIG. 4D is fed through an input terminal 32 to the base of the transistor 30a, pulse width modulated signals P and P', which are different in polarity as shown in FIGS. 4D and 4E, are obtained at output terminals 33a and 33b connected to the collectors of the transistors 30a and 30b, respectively. In the example of FIG. 5, the emitters of the transistors 30a and 30b are connected together to a constant current source 34, their bases are connected through resistors 41 and 43 to the terminal 18 and grounded through resistors 42 and 44, respectively, and their collectors are respectively connected through resistors 45 and 46 to the terminal 18.

FIG. 6 shows another example of the phase splitter 5 usable in this invention, in which the pulse signal P shown in FIG. 4D is fed through an input terminal 36 to the base of a transistor 35 and signals of reverse phase are delivered through coupling capacitors 49 and 50 to output terminals 37a and 37b connected to the collector and emitter of the transistor 35, respectively. The collector of the transistor 35 is connected through a resistor 47 to terminal 18 and its emitter is connected through a resistor 48 to ground.

Since the amplitude comparator 9 used in the embodiment shown in FIG. 2 is well known, its detailed description will be omitted.

With the present invention described as above, the pulse signal which is already subjected to the pulse width modulation is phase-split by the phase splitter 5 and modulation signals of opposite phase are supplied through the low pass filters 7a and 7b to the load 8. Therefore, the signals from the phase splitter 5 passing through the components of two systems thereafter are completely reverse in phase with each other.

Typically, a signal of several hundred kilo-Hertz (100 to 500 kHz) is utilized with the type of system described herein, which results in a high frequency jamming signal being produced between the amplifiers 6a and 6b and the load 8. With this invention, however, since the signals of two systems are reverse in phase as described above, the high frequency jamming signals cancel each other to thereby reduce noise.

With prior art amplifiers using pulse modulation, two signal systems are provided, one of which is a signal system for feeding back the voltage across the load so as to improve the distortion factor and the other of which is a feedback system for maintaining a pulse duty cycle of 50% when there is no signal. Furthermore, in the prior art, it is necessary to provide a circuit which establishes synchronization between a pair of pulse width modulators and so on. With the present invention, however, the voltages at the both ends of the load 8 can be balanced and the distortion factor can be reduced simply by feeding back the voltage difference between both ends of the load 8 to the amplifier 2. Also, with this invention, since the two systems after the phase splitter 5 can be made substantially identical in construction, the circuit of this invention can be simplified as compared with the prior art.

It will be apparent to those skilled in the art that many modifications and variations may be effected without departing from the spirit and scope of the novel concepts of the present invention.

I claim as my invention:
1. A pulse width modulated signal amplifier comprising:
 a. signal input means;
 b. amplifying means for amplifying an input signal from said signal input means;
 c. pulse width modulating means for receiving an output signal from said amplifying means and producing a pulse width modulated signal;

d. phase splitting means for receiving said pulse width modulated signal and producing a pair of corresponding pulse width modulated signals having different polarities to each other;

e. first demodulating means for receiving one of said pair of pulse width modulated signals and demodulating to produce a first output signal having one polarity and an amplitude in response to an amplitude of said input signal;

f. second demodulating means for receiving the other of said pair of pulse width modulated signals and demodulating to produce a second output signal having the other polarity and an amplitude in response to an amplitude of said input signal;

g. a load supplied with said first and second output signals;

h. amplitude comparing means for comparing said first and second output signals in their amplitudes and producing a difference control signal in response thereto; and i. feedback means connected to said comparing means for receiving said control signal and applying it to said amplifying means so as to balance the amplitudes of said first and second output signals with respect to one another across said load.

2. A pulse width modulated signal amplifier according to claim 1, in which each of said first and second demodulating means comprises a pulse amplifier and a low pass filter.

3. A pulse width modulated signal amplifier according to claim 2, in which said phase splitting means comprises a differential amplifier.

4. A pulse width modulated signal amplifier according to claim 2, in which said phase splitting means includes at least a single transistor, a collector-emitter circuit of which is connected between a voltage source and a reference point through a collector load and an emitter load, respectively, and a base electrode of which is supplied with said pulse width modulated signal from said modulating means, to thereby produce a pair of pulse width modulated signals having opposite polarities, one at the collector and one at the emitter electrodes of said transistor.

5. A pulse width modulated signal amplifier according to claim 1, in which said pulse width modulating means comprises a sawtooth wave generator and a slicing circuit, said slicing circuit receiving the output of the sawtooth generator and the input signal from said signal input means so as to produce said pulse width modulated signal.

6. A pulse width modulated signal amplifier according to claim 5, in which said slicing circuit comprises a differential amplifier.

7. A pulse width modulated signal amplifier according to claim 5, in which said sawtooth wave generator comprises a constant current source and a capacitor connected in series across a voltage source, and a transistor having its collector-emitter path connected across said capacitor and its base electrode supplied with a trigger pulse signal, whereby said sawtooth wave signal is produced in synchronism with said trigger pulse signal across said capacitor.

8. A pulse width modulated signal amplifier according to claim 1 in which only one phase splitting means is provided in said pulse width modulated signal amplifier for receiving said pulse width modulated signal, and said pulse width modulating means producing a pulse width modulating signal of only one polarity.

9. A pulse width modulated signal amplifier system for amplifying an input signal and adapted for reducing noise, comprising:

a. amplifying means for amplifying the input signal;

b. pulse width modulating means connected to said amplifying means for producing a pulse width modulated signal;

c. phase splitting means connected to said modulating means for producing a pair of corresponding but opposite polarity signals;

d. first demodulating means connected to said phase splitting means for demodulating one of said signals from said phase splitting means;

e. second demodulating means connected to said phase splitting means for demodulating the other of said signals from said phase splitting means;

f. a load connected between said first and second demodulating means;

g. amplitude comparing means for comparing said signals from said first and second demodulating means in their amplitudes and producing a difference control signal in response thereto;

h. feedback means connected to said comparing means for receiving said control signal and applying it to said amplifying means so as to balance the amplitudes of said signals from said first and second demodulating means with respect to one another across said load; and i. only one phase splitting means being provided in said pulse width modulated signal amplifier for receiving said pulse width modulated signal, and said pulse width modulating means producing a pulse width modulating signal of only one polarity.

* * * * *

UNITED STATES PATENT AND TRADEMARK OFFICE
CERTIFICATE OF CORRECTION

PATENT NO. : 4,004,246
DATED : January 18, 1977
INVENTOR(S) : Osamu Hamada

It is certified that error appears in the above-identified patent and that said Letters Patent are hereby corrected as shown below:

Below the name of the Inventor, the following should be added:

"Assignee: Sony Corporation
Tokyo, Japan"

Signed and Sealed this

Twenty-fourth Day of May 1977

[SEAL]

Attest:

RUTH C. MASON
*Attesting Officer*

C. MARSHALL DANN
*Commissioner of Patents and Trademarks*